(12) United States Patent
Imai

(10) Patent No.: US 7,294,847 B2
(45) Date of Patent: Nov. 13, 2007

(54) RADIOGRAPHIC IMAGE DETECTOR

(75) Inventor: Shinji Imai, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/015,028

(22) Filed: Dec. 20, 2004

(65) Prior Publication Data
US 2005/0133744 A1 Jun. 23, 2005

(30) Foreign Application Priority Data
Dec. 19, 2003 (JP) ............................. 2003-422347

(51) Int. Cl.
*G21K 4/00* (2006.01)
(52) U.S. Cl. .................................................. 250/580
(58) Field of Classification Search ................ 250/580, 250/370.09, 585, 590; 378/28, 31, 32
See application file for complete search history.

(56) References Cited
U.S. PATENT DOCUMENTS

| | | | |
|---|---|---|---|
| 4,675,261 A | * | 6/1987 | Ohara et al. ................... 430/53 |
| 5,523,609 A | * | 6/1996 | Fukusho ...................... 257/435 |
| 6,770,901 B1 | | 8/2004 | Ogawa et al. |
| 2001/0025938 A1 | * | 10/2001 | Imai ........................... 250/591 |
| 2003/0146371 A1 | * | 8/2003 | Gudesen et al. .......... 250/214.1 |

* cited by examiner

*Primary Examiner*—David Porta
*Assistant Examiner*—David S Baker

(57) ABSTRACT

A radiographic image detector includes a first electrode layer, a first photoconductive layer, a second photoconductive layer, and a second electrode layer. The second electrode layer has a first stripe electrode, in which a plurality of first line electrodes are arranged in parallel at predetermined intervals, and a second stripe electrode, in which a plurality of second line electrodes are arranged in parallel between the first line electrodes. The radiographic image detector further includes an insulating member, which is mounted on the side surfaces extending in a longitudinal direction of the second line electrode and on the top surface of the second line electrode continuous to the side surfaces.

16 Claims, 4 Drawing Sheets

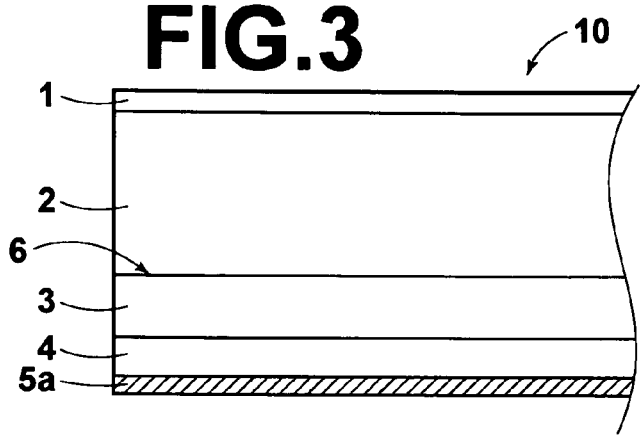
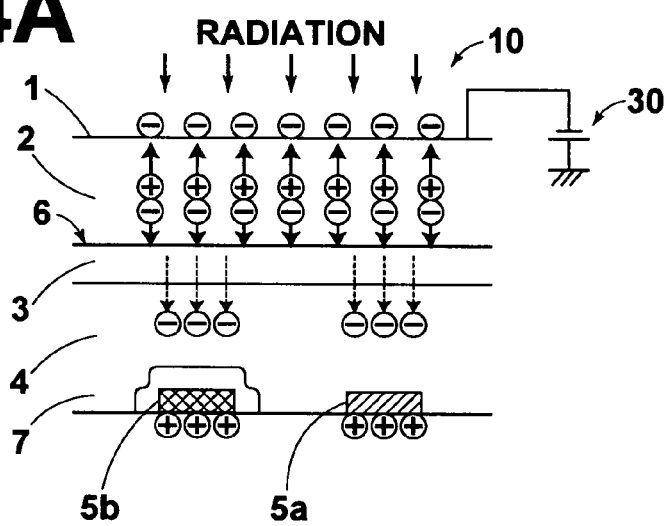
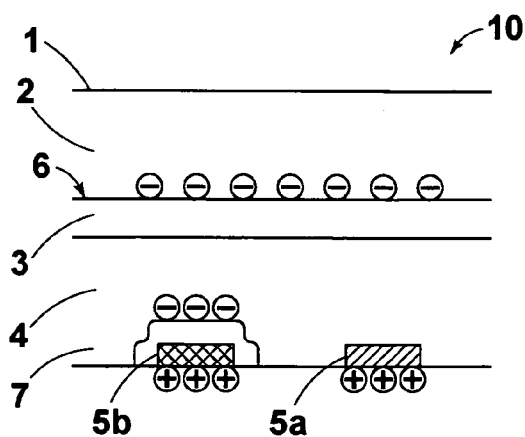

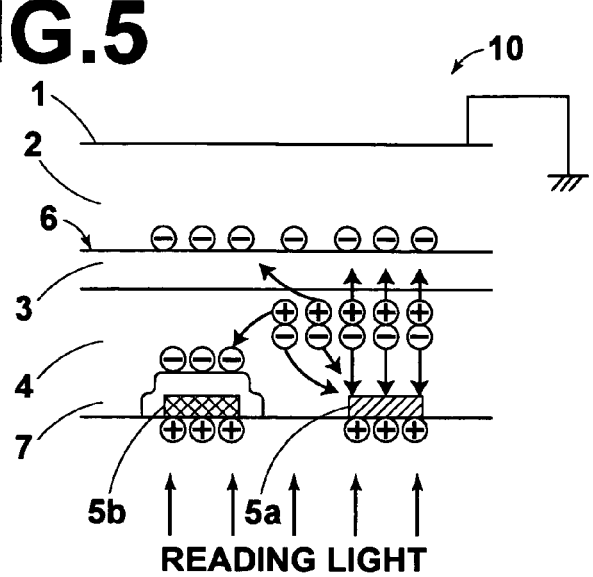
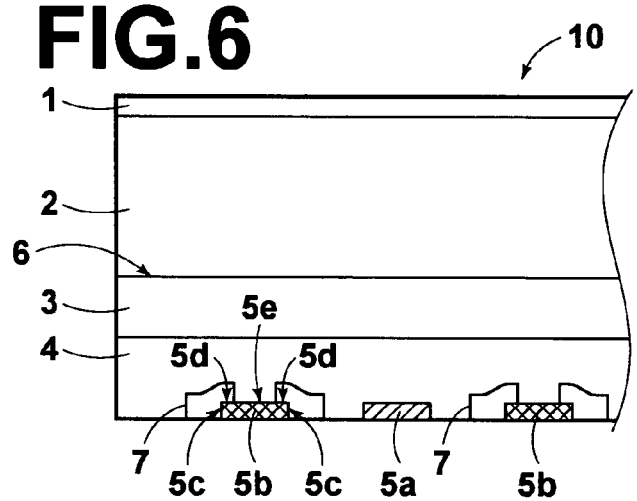
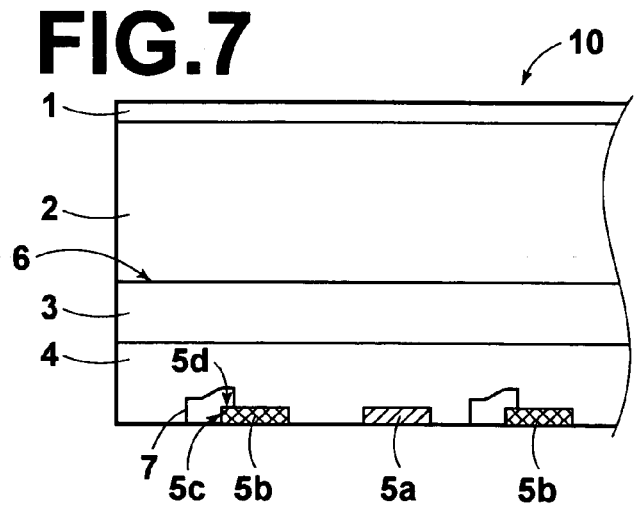

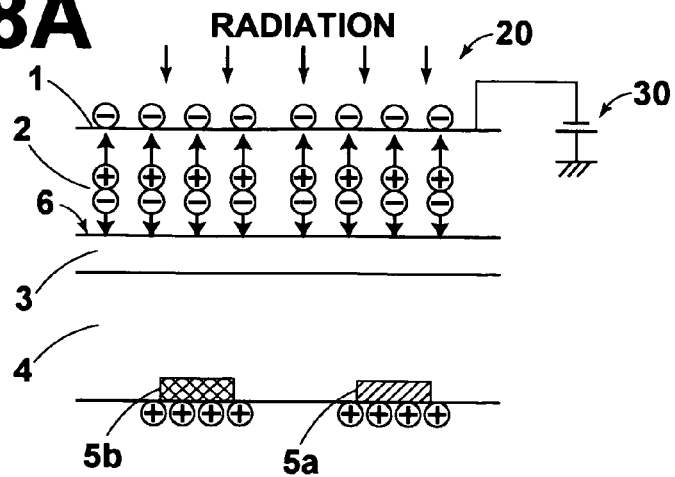
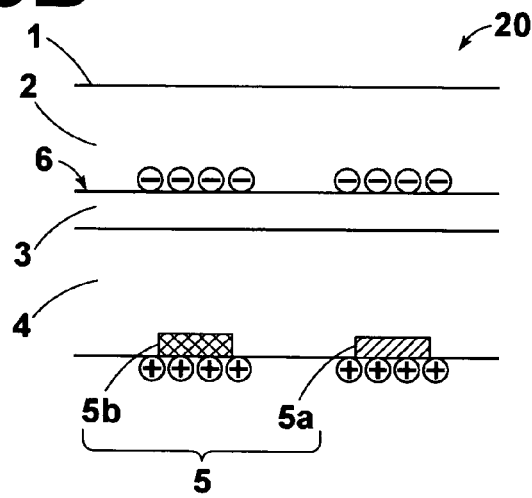
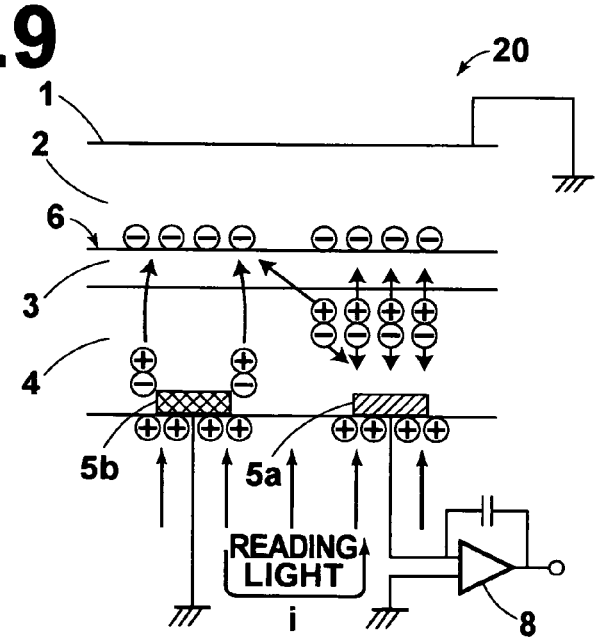

RADIOGRAPHIC IMAGE DETECTOR

BACKGROUND OF THE INVENTION

1. Field of the Invention

The present invention relates to a radiographic image detector on which a radiographic image is recorded by being irradiated with radiation carrying the radiographic image, and from which a signal corresponding to that radiographic image is read out by being scanned with image-reading light.

2. Description of the Related Art

In the medical field, a variety of radiographic image detectors have been proposed and put to practical use, in which electric charges are produced by being irradiated with radiation transmitted through a radiographer object, and a radiographic image relating to the radiographer object is recorded by storing the produced electric charges.

Such a radiographic image detector has been proposed, for example, in U.S. Pat. No. 6,770,901. This radiographic image detector includes a first electrode layer for transmitting radiation, a photoconductive recording layer for producing electric charges by being irradiated with radiation, an electric-charge transporting layer that operates as an insulator with respect to latent-image electric charges and operates as a conductor with respect to transport electric charges having polarities opposite from the latent-image electric charges, a photoconductive read-out layer for producing electric charges by being irradiated with image-reading light, and a second electrode layer in which first line electrodes for transmitting the image-reading light and second line electrodes for intercepting the image-reading light are alternately arranged in parallel. These layers are stacked in the recited order.

When recording a radiographic image onto the radiographic image detector constructed as described above, radiation is first irradiated onto the detector 20 with a negative high voltage applied to the first electrode layer 1 of the detector 20 by a high-voltage source 30 connected to the first electrode layer 1, as shown in FIG. 8A. Then, the radiation is transmitted through the first electrode layer 1 and irradiated onto a photoconductive recording layer 2. At a portion of the photoconductive recording layer 2 irradiated with radiation, electric charge pairs are produced. The positive electric charges of the electric charge pairs move toward the negative-charged first electrode layer 1, combine with the negative electric charges in the first electrode layer 1 and are neutralized. On the other hand, the negative charges of the electric charge pairs move toward a positive-charged second electrode layer 5, but since an electric-charge transporting layer 3 operates as an insulator with respect to negative charges, the above-described negative charges are stored at an charge accumulating portion 6, which is the interface between the photoconductive recording layer 2 and the electric-charge transporting layer 3. A radiographic image is recorded by the storage of the negative charges on the charge accumulating portion 6.

And when reading out from the radiographic image detector 20 the radiographic image recorded as described above, image-reading light is first irradiated onto the second electrode layer 5, as shown in FIG. 9. The image-reading light is transmitted through the first line electrode 5*a* of the second electrode layer 5 and is irradiated onto a photoconductive read-out layer 4, in which electric charge pairs are produced. The positive charges of the produced electric charge pairs combine with the negative charges stored at the charge accumulating portion 6, while the negative charges of the electric charge pairs combine with positive charges at the first line electrode 5*a* and with positive charges flowing to the first line electrode 5*a* through ground from a second line electrode 5*b*. As a result, a current I is detected by a current-detecting amplifier 8 connected to the first line electrode 5*a*. The current I is converted into a voltage, which is output as an image signal.

However, when image-reading light is irradiated near the edge of the second line electrode 5*b*, as shown in FIG. 9, there are cases where electric discharge occurs near the edge of the second line electrode 5*b*. Positive charges produced by this edge discharge combine with the negative charges stored at the charge accumulating portion, so the amount of negative charges to combine with the positive charges at the first line electrode 5*a* is reduced. For this reason, the current I detected by the current-detecting amplifier is reduced and the image read-out efficiency is reduced. This results in the degradation of the picture quality of a read out radiographic image.

SUMMARY OF THE INVENTION

The present invention has been made in view of the circumstances described above. Accordingly, it is the primary object of the present invention to provide a radiographic image detector that is capable of enhancing picture quality by preventing electric discharge from occurring near the edge of the second line electrode.

To achieve this end, there is provided a radiographic image detector in accordance with the present invention. The radiographic image detector includes a first electrode layer for transmitting electromagnetic waves carrying a radiographic image, a photoconductive recording layer for producing electric charges by being irradiated with the electromagnetic waves, and a charge accumulating portion for storing the electric charges produced in the photoconductive recording layer. The radiographic image detector also includes a photoconductive read-out layer for producing electric charges by being irradiated with image-reading light, and a second electrode layer. The second electrode layer has a first stripe electrode, in which a plurality of first line electrodes for transmitting the image-reading light are arranged in parallel at predetermined intervals, and a second stripe electrode, in which a plurality of second line electrodes are arranged in parallel between the first line electrodes. The radiographic image detector further includes an insulating member, which is mounted on at least one of the side surfaces extending in a longitudinal direction of the second line electrode and on a part or whole of the top surface of the second line electrode continuous with the side surfaces. The first electrode layer, the photoconductive recording layer, the photoconductive read-out layer, and the second electrode layer are stacked in this order.

It is preferable that the aforementioned "part of the top surface" be an edge portion of the top surface extending from one end to another end of the line electrode along the side surface of the line electrode.

In the radiographic image detector of the present invention, the insulating member may be formed from a material that absorbs the image-reading light.

In the radiographic image detector of the present invention, the image-reading light may be blue light. In this case, the insulating member is formed from a material in which diaminoanthranilic red is dispersed in acrylic resin. The image-reading light may also be red light. In this case, the insulating member is formed from a material in which copper phthalocyanine is dispersed in acrylic resin.

According to the radiographic image detector of the present invention, an insulating member for intercepting image-reading light is mounted on at least one of the side surfaces extending in a longitudinal direction of the second line electrode and on a part or whole of the top surface of the second line electrode continuous to the side surfaces. Therefore, electric discharge from the edge of the second line electrode can be prevented. Since a reduction in the image read-out efficiency due to the electric discharge from the electrode edge can be prevented, the picture quality of a radiographic image read out can be enhanced.

BRIEF DESCRIPTION OF THE DRAWINGS

The present invention will be described in further detail with reference to the accompanying drawings wherein:

FIG. 3 is a sectional view of the radiographic image detector taken along line 3-3 of FIG. 1;

FIGS. 4A and 4B are sectional views used to explain how a radiographic image is recorded by the radiographic image detector shown in FIG. 1;

FIG. 5 is a sectional view used to explain how the recorded radiographic image is read out from the radiographic image detector shown in FIG. 1;

FIG. 6 is a sectional view showing a radiographic image detector constructed in accordance with a second embodiment of the present invention;

FIG. 7 is a sectional view showing a radiographic image detector constructed in accordance with a third embodiment of the present invention;

FIGS. 8A and 8B are sectional views used to explain how a radiographic image is recorded by a conventional radiographic image detector; and FIG. 9 is a sectional view used to explain how the recorded radiographic image is read out from the conventional radiographic image detector.

DESCRIPTION OF THE PREFERRED EMBODIMENTS

Figure 1:
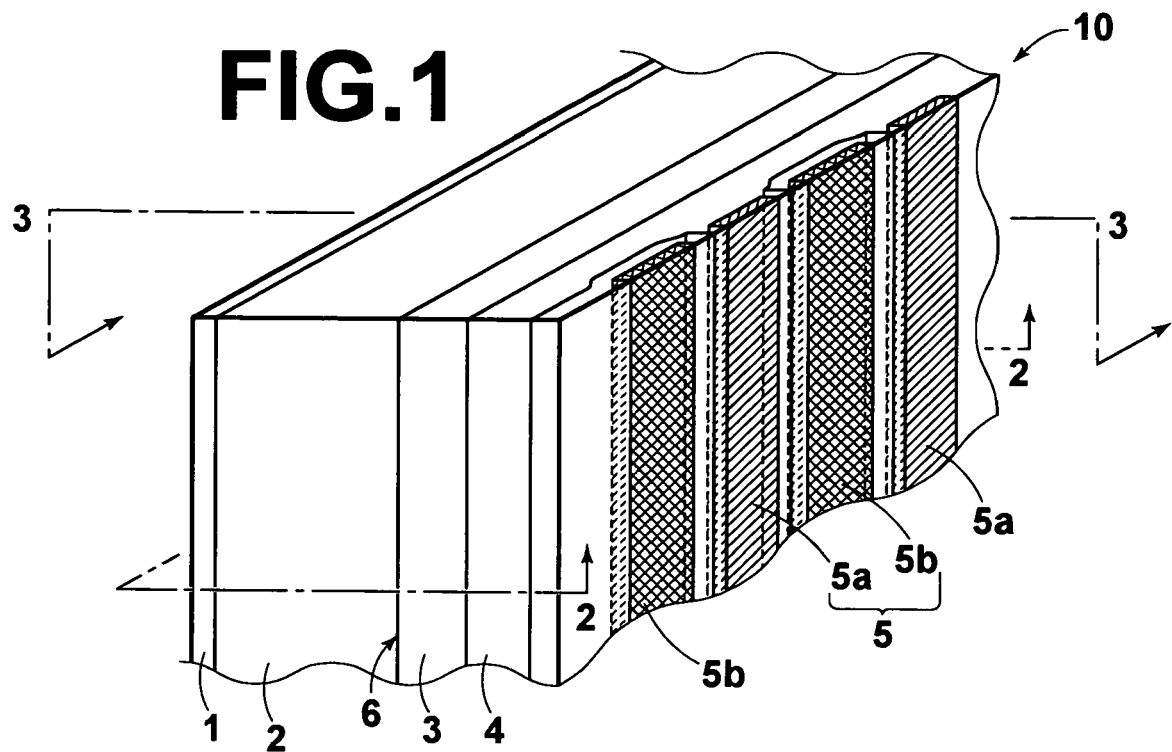
FIG. 1 is a perspective view showing a radiographic image detector constructed in accordance with a first embodiment of the present invention.

Referring now in greater detail to the drawings and initially to FIG. 1, there is shown a radiographic image detector 10 constructed in accordance with a first embodiment of the present invention. The radiographic image detector 10 includes a first electrode layer 1 for transmitting radiation (electromagnetic waves, etc.) carrying a radiographic image, a photoconductive recording layer 2 for producing electric charges by being irradiated with the radiation transmitted through the first electrode layer 1, and an electric-charge transporting layer 3 that operates as an insulator with respect to the electric charges produced in the photoconductive recording layer 2 and also operates as a conductor with respect to transport electric charges having polarities opposite from the electric charge produced in the photoconductive recording layer 2. The radiographic image detector 10 further includes a photoconductive read-out layer 4 for producing electric charges by being irradiated with image-reading light, and a second electrode layer 5 that has a first stripe electrode consisting of first line electrodes 5a for transmitting the image-reading light and a second stripe electrode consisting of second line electrodes 5b for intercepting the image-reading light. These layers 1 through 5 are stacked in the recited order. Also, between the photoconductive recording layer 2 and electric-charge transporting layer 3, there is formed a charge accumulating portion 6 for storing the electric charges produced in the photoconductive recording layer 2. The above-described layers 1 to 5 are formed on a glass substrate in the order listed from the second electrode 5, but for clarity, the glass substrate is not shown in FIGS. 1 to 3.

The first electrode layer 1 can employ a film of 50 to 200 nm in thickness, which transmits radiation, such as a $SnO_2$ film, an indium tin oxide (ITO) film, an IDEMITSU indium X-metal oxide (IDIXO) film (which is an amorphous light-transmitting metal oxide film), etc. It can also employ a 100-nm-thick film of Al or Au.

The second electrode 15 has a first stripe electrode and a second stripe electrode, as described above, and the first line electrodes 5a of the first stripe electrode and the second line electrodes 5b of the second stripe electrode are alternately arranged in parallel at predetermined intervals, as shown in FIG. 1. The material of the first line electrode 5a may be any conductive material for transmitting image-reading light. For example, it is able to employ ITO or IDIXO, as with the first electrode layer 1. It may also employ a metal film (Al, Cr, etc.) formed to a thickness (e.g., about 10 nm) such that it can transmit image-reading light. The material of the second line electrode 5b may be any conductive material that intercepts image-reading light. For instance, it can employ a metal film (Al, Cr, etc.) formed to a thickness (e.g., about 100 nm) such that it can intercept image-reading light.

The material of the photoconductive recording layer 2 may be a material that produces electric charges by being irradiated with radiation. One example is a material that has a-Se, which is relatively high in quantum efficiency with respect to radiation and also high in dark resistance, as a main component. A suitable thickness is about 500 μm.

The charge-transferring layer 3 employs a material in which the difference between the mobility of an electric charge on the first electrode layer 1 and the mobility of an electric charge of opposite polarity is great (e.g., $10^2$ or greater, preferably $10^3$ or greater). Suitable materials are an organic compound (such as, poly-N-vinylcarbazole (PVK), N,N'-diphenyl-N,N'-bis(3-methylphenyle)-[1,1'-biphenuyl]-4,4'-diamine (TPD), discotic liquid crystal, etc.), a polymer (polycarbonate, polystyrene, PVK) dispersion substance of TPD, and a semiconductor substance such as a-Se doped with 10 to 200 ppm of Cl.

The photoconductive read-out layer 4 employs a material that exhibits photoconductivity by being irradiated with image-reading light. For example, a preferable material is a photoconductive material that has at least one of a-Se, Se-Te, Se-As-Te, organic phthalocyanine, metal phthalocyanine, MgPc (magnesium phthalocyanine), VoPc (phase II of vanadyl phthalocyanine), or CuPc (copper phthalocyanine), as its main component. A suitable thickness is about 0.1 to 1 μm.

Figure 2:
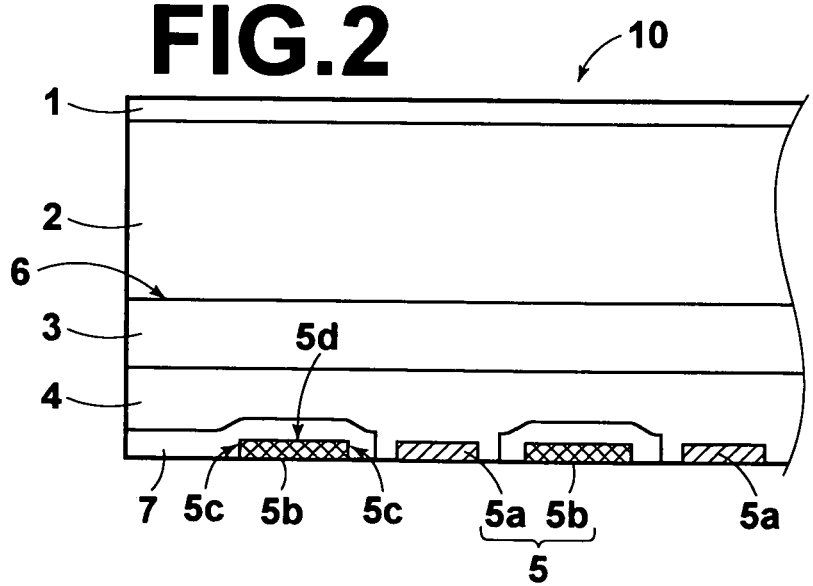
FIG. 2 is a sectional view of the radiographic image detector taken along line 2-2 of FIG. 1.

In the radiographic image detector 10 of the first embodiment, an insulatingmember 7 ismountedon the side surfaces 5c and top surface 5d extending in the longitudinal direction of the second line electrode 5b, as shown in FIGS. 1 and 2. The insulating member 7 can prevent electric discharge from occurring near the edge of the second line electrode 5b and is also used to intercept image-reading light. The insulating member 7 can utilize a material that absorbs image-reading light. For instance, in the case where image-reading light is blue light, the insulating member 7 can utilize a red insulating material that absorbs blue light. An example is an insulating material in which diaminoanthranilic red is dispersed in acrylic resin. In the case where image-reading light is red light, the insulating member 7 can utilize a blue insulating material that absorbs red light. An example is an insulating material in which copper phthalocyanine is dispersed in acrylic resin. That is, the insulating material 7 is not limited to the aforementioned materials, but may utilize an insulating material having a color complementary to the wavelength of image-reading light.

When reading out a radiographic image by employing the radiographic image detector 10 constructed as described above, the insulating material 7 can absorb image-reading light. Therefore, electric discharge is prevented from occurring at the edge of the second line electrode 5b, as is done in the conventional radiographic image detector 20. As a result, a reduction in the image read-out efficiency due to the edge discharge is prevented.

In recording a radiographic image by employing the radiographic image detector 10 constructed as described above, in the case of a massive dose of radiation, negative charges produced in the photoconductive read-out layer 2 sometime pass through the charge accumulating portion 6 and electric-charge transporting layer 3, as shown in FIG. 4A. The negative charges remain near the insulating member 7 mounted on the second line electrode 5b, as shown in FIG. 4B. If the radiographic image recorded as described above is read out from the radiographic image detector 10, the positive charges produced in the photoconductive read-out layer 4 combine with the negative charges near the insulating member 7. As a result, not only the negative charges on the charge accumulating portion 6 but also the negative charges near the insulating layer 7 are detected as an image signal. Particularly, the negative charges remaining near the insulating layer 7 combine with the positive charges produced in the photoconductive read-out layer 4 with a very great time constant, so an afterimage develops in a radiographic image based on the detected image signal.

Hence, as shown in FIG. 6, it is desirable to mount insulating members 7 on the side surfaces 5c of the second line electrode 5b and on the edge portions 5d, which is a part of the top surface, continuous with the side surfaces 5c. No insulating member is mounted on the top surface 5e other than the edge portions 5d. If the insulating members 7 are mounted as described above, the above-described negative charges flow out from the second line electrode 5b, and the negative charges are prevented from being stored near the insulating member 7 mounted on the second line electrode 5b, as is done in the radiographic image detector 10 shown in FIG. 5. As a result, the occurrence of an afterimage due to the above-described negative charge can be prevented.

In addition, the insulating members 7 do not necessarily need to be mounted on both side surfaces 5c of the second line electrode 5b, as is done in the second embodiment shown in FIG. 6. For example, as shown in FIG. 7, an insulating member 7 may be mounted on one of the side surfaces 5c extending in the longitudinal direction of the second line electrode 5b and on a part or whole of the top surface of the second line electrode 5b continuous with the one side surface.

While the present invention has been described with reference to the preferred embodiments thereof, the invention is not to be limited to the details given herein, but may be modified within the scope of the invention hereinafter claimed. For example, the radiographic image detector may contain additional layers.

What is claimed is:

1. A radiographic image detector comprising:
    a first electrode layer for transmitting electromagnetic waves carrying a radiographic image;
    a photoconductive recording layer for producing electric charges by being irradiated with said electromagnetic waves;
    a charge accumulating portion for storing said electric charge produced in said photoconductive recording layer;
    a photoconductive read-out layer for producing electric charges by being irradiated with image-reading light;
    a second electrode layer having a first stripe electrode, in which a plurality of first line electrodes for transmitting said image-reading light are arranged in parallel at predetermined intervals, and a second stripe electrode, in which a plurality of second line electrodes are arranged in parallel between said first line electrodes; and
    an insulating member mounted on at least one of side surfaces extending in a longitudinal direction of said second line electrode and on a part or whole of a top surface of said second line electrode continuous to said side surfaces,
    wherein said insulating member is formed from a material that absorbs said image-reading light;
    said first electrode layer, said photoconductive recording layer, said photoconductive read-out layer, and said second electrode layer being stacked in this order.

2. The radiographic image detector as set forth in claim 1, wherein said image-reading light is blue light and said insulating member is formed from a material in which diaminoanthranilic red is dispersed in acrylic resin.

3. The radiographic image detector as set forth in claim 1, wherein said image-reading light is red light and said insulating member is formed from a material in which copper phthalocyanine is dispersed in acrylic resin.

4. The radiographic image detector as set forth in claim 1, wherein said insulating member is formed from a red insulating material that absorbs blue light.

5. The radiographic image detector as set forth in claim 1, wherein said insulating member is formed from an insulating material having a color complementary to a wavelength of the image reading light.

6. The radiographic image detector of claim 1, wherein the first electrode layer employs a film comprising at least one of SnO2, indium tin oxide (ITO), and IDEMITSU indium X-metal oxide (IDIOX).

7. The radiographic image detector of claim 6, wherein the film has a thickness of about 50 nm to 200 nm.

8. The radiographic image detector of claim 1, wherein the first electrode layer employs a film comprising at least one of Al and Au.

9. The radiographic image detector of claim 8, wherein the film has a thickness of about 100 nm.

10. The radiographic image detector of claim 1, wherein the first line electrodes employ a film comprising at least one of indium tin oxide (ITO), and IDEMITSU indium X-metal oxide (IDIOX).

11. The radiographic image detector of claim 10, wherein the film has a thickness of about 50 nm to 200 nm.

12. The radiographic image detector of claim 1, wherein the first line electrodes employ a film comprising at least one of Al and Cr.

13. The radiographic image detector of claim 12, wherein the film has a thickness of about 10 nm.

14. The radiographic image detector of claim 1, wherein the second line electrodes employ a film comprising at least one of Al and Cr.

15. The radiographic image detector of claim 14, wherein the film has a thickness of about 10 nm.

16. A radiographic image detector comprising:
- a first electrode layer for transmitting electromagnetic waves carrying a radiographic image;
- a photoconductive recording layer for producing electric charges by being irradiated with said electromagnetic waves;
- a charge accumulating portion for storing said electric charge produced in said photoconductive recording layer;
- a photoconductive read-out layer for producing electric charges by being irradiated with image-reading light;
- a second electrode layer having a first stripe electrode, in which a plurality of first line electrodes for transmitting said image-reading light are arranged in parallel at predetermined intervals, and a second stripe electrode, in which a plurality of second line electrodes are arranged in parallel between said first line electrodes; and
- an insulating member mounted on at least one of side surfaces extending in a longitudinal direction of said second line electrode and on a part of a top surface of said second line electrode continuous to said side surfaces, and leaving a central part of said top surface in direct contact with the photoconductive read out layer;
- said first electrode layer, said photoconductive recording layer, said photoconductive read-out layer, and said second electrode layer being stacked in this order.

* * * * *